United States Patent
Kronmüller et al.

(10) Patent No.: US 11,923,845 B1
(45) Date of Patent: Mar. 5, 2024

(54) TIMING CONTROLLED LEVEL SHIFTER CIRCUIT

(71) Applicant: Apple Inc., Cupertino, CA (US)

(72) Inventors: Frank M. Kronmüller, Kirchheim unter Teck (DE); Mahir Uka, Kirchheim unter Teck (DE); Amedeo Bertone, Ulm (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/931,055

(22) Filed: Sep. 9, 2022

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC .............................. H03K 19/018514–018528
See application file for complete search history.

(56) References Cited

U.S. PATENT DOCUMENTS

| 7,471,113 | B1 | 12/2008 | Lim |
| 7,808,294 | B1* | 10/2010 | Kottapalli ........ H03K 3/356165 |
| | | | 327/333 |
| 8,446,173 | B1 | 5/2013 | Faucher et al. |
| 9,112,486 | B2 | 8/2015 | Anderson |
| 2010/0127751 | A1* | 5/2010 | Lin ................ H03K 19/018521 |
| | | | 327/333 |

* cited by examiner

*Primary Examiner* — Patrick O Neill
(74) *Attorney, Agent, or Firm* — Kowert, Hood, Munyon, Rankin & Goetzel, P.C.; Erik A. Heter; Dean M. Munyon

(57) ABSTRACT

A level shifter circuit is disclosed. The level shifter includes an input circuit configured to receive an input signal generated using a first power supply voltage level and generate, using the first power supply voltage level, a first control signal and a second control signal using the input signal. The level shifter further includes a shifter circuit configured to generate a first shifted signal and a second shifted signal using the first control signal, the second control signal, and second power supply voltage level different than the first power supply voltage level, and a selection circuit configured to select, using a value of a previous output signal and the second power supply voltage level, one of the first shifted signal or the second shifted signal to generate a current output signal.

20 Claims, 8 Drawing Sheets

TIMING CONTROLLED LEVEL SHIFTER CIRCUIT

BACKGROUND

Technical Field

This disclosure relates to electronic circuits, and more particularly, to level shifter circuits.

Description of the Related Art

Many integrated circuits have voltage domains in which circuits operate according to different supply voltages. For example, in an integrated circuit having processing circuitry and input/output (I/O) circuitry, the processing circuitry may operate at a different voltage than the I/O circuitry. Nevertheless, the processing circuitry may need to receive inputs from and provide output the I/O circuitry. Accordingly, level shifter circuits may be implemented in signal paths between these circuits. A level shifter circuit may receive a signal from circuitry operating according to a first voltage, and output the signal at a level appropriate for circuitry operating according to a second, different voltage. Level shifter circuits may be provided to level shift a signal from a domain having a lower supply voltage to one having a higher supply voltage, or vice versa.

SUMMARY

A level shifter circuit is disclosed. In one embodiment, a level shifter includes an input circuit configured to receive an input signal generated using a first power supply voltage level and generate, using the first power supply voltage level, a first control signal and a second control signal using the input signal. The level shifter further includes a shifter circuit configured to generate a first shifted signal and a second shifted signal using the first control signal, the second control signal, and second power supply voltage level different than the first power supply voltage level, and a selection circuit configured to select, using a value of a previous output signal and the second power supply voltage level, one of the first shifted signal or the second shifted signal to generate a current output signal.

In some embodiments, the selection circuit is a single stage circuit, and performs a selection based on which node in the shifter circuit is the slowest one to shift. In other embodiments, the selection circuit is a multi-stage circuit, and makes a selection based on which node of the shifter circuit is the fastest to shift. In both types of embodiments, the time from the input transition to the output signal transition may be substantially the same. This may overcome the difference in output signal transition times that may be present in previous level shifter circuits due to the imbalance that can be present.

BRIEF DESCRIPTION OF THE DRAWINGS

The following detailed description makes reference to the accompanying drawings, which are now briefly described.

DETAILED DESCRIPTION OF EMBODIMENTS

The present disclosure is directed to a level shifter circuit that is designed to substantially equalize the transition time of an output signal despite any imbalance in the shifting operation.

Level shifter circuits are commonly used to level shift signals from one voltage domain to another. Due to differences in the operation of PMOS and NMOS transistors and the cross-coupled configurations of the PMOS transistors, one of the internal nodes will transition faster than the other for a given logic input transition. Accordingly, a 0 to 1 transition will have different timing characteristics than a 1-0 transition when the same node is used to generate the level shifter output signal.

The present disclosure makes use of the insight that, if the node generating the transition was selected based on the particular logic transition, the timing of the output signal could be made to be substantially equal. Accordingly, a level shifter circuit is disclosed herein in which the node used to generate the output signal changes depending on the particular logic transition. In various embodiment, the level shifter circuit includes a selection circuit (e.g., a multiplexer) that receives input signals based on those generated on internal nodes of the level shifter circuit. In one embodiment, the selection circuit is configured to select whichever node transitions the slowest so that that delay between the input and the output is substantially the same irrespective of the logic transition of the input. The output of the selection can also be used to generate the selection signals used by the selection circuit. The present disclosure also contemplates an embodiment in which the selection circuit makes a selection based on the fastest transitioning internal node.

Thus, the level shifter of the present disclosure may be used in timing critical applications where a timing difference that is dependent on the logic transition of the input signals would otherwise be impractical or fatal. Since the timing of the output transitions is substantially the same irrespective of the input logic transition, the level shifter can be used to transmit signals such as a clock signal between two power domains operating according to different supply voltages.

The description below begins with a discussion of a block diagram of a level shifter circuit according to the disclosure. Thereafter, schematic diagrams of two different embodiments are discussed. A stabilization circuit used to stabilize a selection signal is also disclosed. Thereafter, descriptions are provided for various methods for operating a level shifter circuit according the disclosure. The discussion concludes with a description of an example system that may include integrated circuits with multiple power domains, and thus, level shifter circuits for conveying signals there between.

Figure 1:
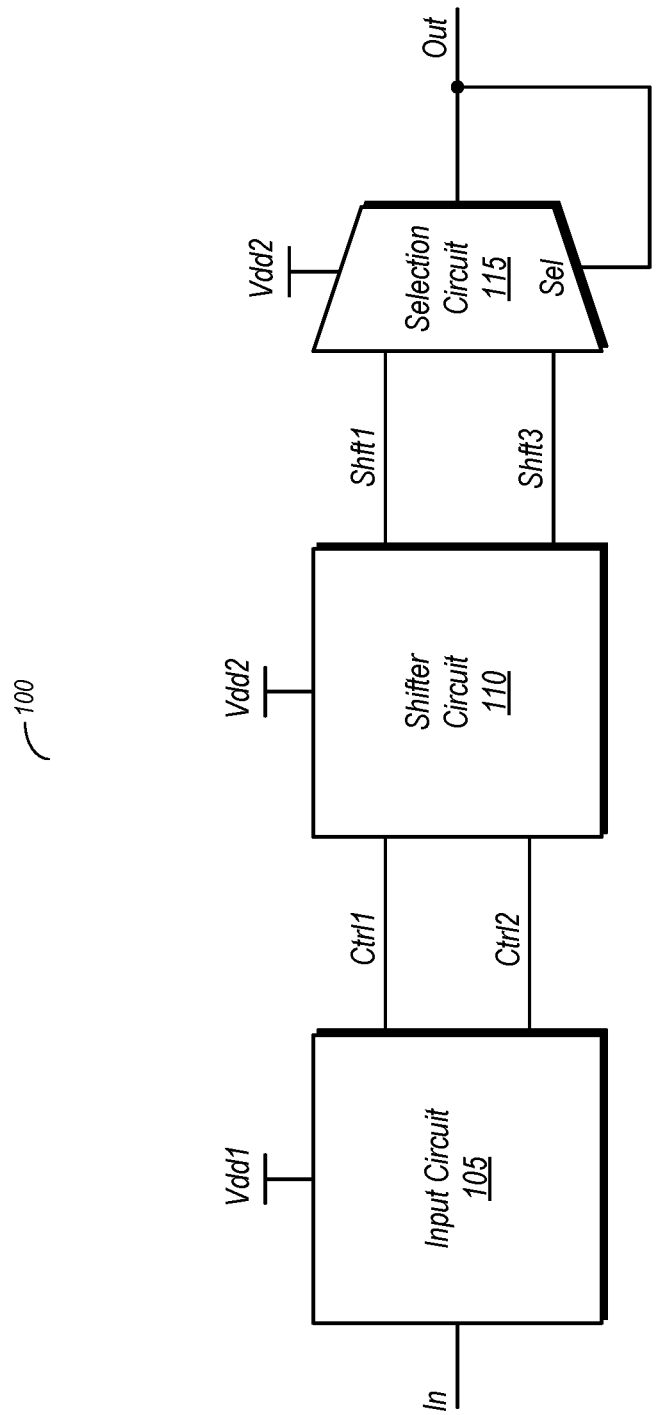
FIG. 1 is a block diagram of one embodiment of a level shifter circuit.

Level Shifter Circuit with Equalized Output Signal Transition Times:

FIG. 1 is a block diagram of one embodiment in accordance with the present disclosure. In the embodiment shown, level shifter circuit includes an input circuit 105, a shifter circuit 110, and a selection circuit 115.

Input circuit 105 in the embodiment shown is configured to receive an input signal that is generated using a first power supply voltage level, Vdd1. Using the input signal and the first supply voltage, input circuit 105 is configured to generate first and second control signals, Ctrl1 and Ctrl2, respectively. The control signals are received by shifter circuit 110, which operates using a second power supply voltage level, Vdd2. Shifter circuit 110 is configured to generate first and second shifted signals (Shft1 and Shft2) using the first and second control signals, respectively, and the second supply voltage. It is noted that the second supply voltage is different than the first supply voltage. In various embodiments, the second supply voltage is greater than the first supply voltage, although embodiments in which the first supply voltage is greater are possible and contemplated.

Selection circuit 115 in the embodiment shown is configured to select, using a value of a previous output signal and the second supply voltage, one of the first shifted signal or the second shifted signal to generate a current output signal, Out. In various embodiments, the selection carried out by selection circuit 115 is based on the particular transition of the input signal. Whenever the input signal transitions, the two nodes upon which the shifted signals are generated switch at different times. More particularly, one of these nodes will switch slower than the other, dependent upon the logical transition of the input signal. If left unchecked, the could change the timing of the generation of the output signal with respect to the different logic transitions of the input signal. However, selection circuit 115 in the embodiment shown is configured to base its selection on the logical transition to ensure that the logical transition of the output signal occurs at a substantially equal delay for both possible logical transitions. In one embodiment, selection circuit 115 is configured to select the one of the shifted signals corresponding to the slowest node to switch, which changes between the two possible logical transitions. In another embodiment, selection circuit 115 is configured to select the one of the shifted signals corresponding to the fastest node to switch.

Selection circuit 115 is configured to update the value of the selection signal provided to the selection input, Sel, any time the output undergoes a logical transition. This in turn readies selection circuit 115 to make the proper selection for the next logical transition and thus ensure the input-to-output signal transition timing remains consistent.

Figure 2:
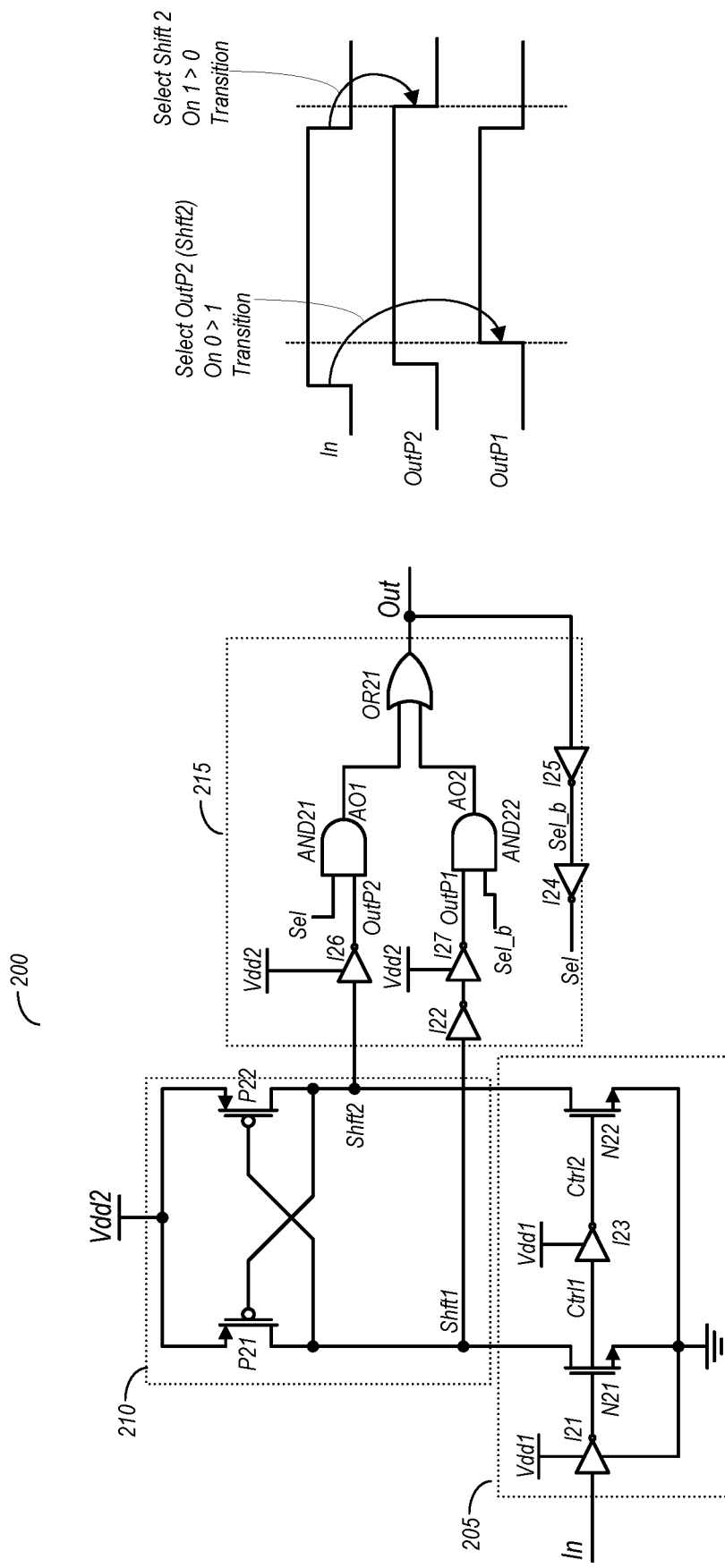
FIG. 2 is a schematic diagram of an embodiment of a level shifter circuit.

Schematic Diagrams of Level Shifter Circuit Embodiments:

FIG. 2 is a schematic diagram of one embodiment of a level shifter circuit in accordance with the present disclosure. In the embodiment shown, level shifter 200 includes a control circuit 205, a shifter circuit 210, and a selection circuit 215. In this particular embodiment, level shifter 200 is arranged such that the slowest internal node of shifter circuit 210 is the source of the shifted signal upon which the generation of the output signal is based.

Control circuit 205 in the embodiment shown is coupled to receive the input signal, In, and generate first and second control signals Ctrl1 and Ctrl2, respectively. The first control signal, Ctrl1, is generated by inverting the input signal using I21, which operates using a first supply voltage Vdd1. The second control signal, Ctrl2, is generated by inverting the first control signal using inverter I23, which also operates using Vdd1. The first control signal is provided to a gate terminal of NMOS device N21, while the second control signal is provided to the gate terminal of NMOS device N22. Since the control signals are effectively complements of one another in this embodiment, only one of N21 and N22 is active at a given time. Both devices N21 and N22 are pulldown devices that pull a respectively coupled internal node of shifter circuit 210 toward ground.

Shifter circuit 210 in the embodiment shown includes PMOS devices P21 and P22, which are cross-coupled with respect to one another. When one of these devices is active, a pull-up path is provided between a corresponding internal node and a second supply voltage, Vdd2. Since PMOS devices may be weak by design, the node that is pulled up on a transition of the input signal may change states slower than the node that is pulled down. This creates a timing mismatch between the generation of the shift signals, Shft1 and Shft2. In embodiments in which the output of the level shifter is taken based on a single node, this timing mismatch is propagated downstream to the generation of the output signal, and thus to any circuit that receives the output signal from the level shifter. However, in the embodiment shown, the shifted signal upon which Selection circuit 115 in the embodiment shown is coupled to receive the shifted signals. Using the shifted signals, the second supply voltage Vdd, and selection signals, selection circuit 215 in the embodiment shown generates an output signal, Out. The first shifted signal, Shft1 is received on the input of inverter I22, inverted, and then inverted again by inverter I27 to generate a first preliminary output signal, OutP1. The second shifted signal, Shft2, is received at inverter I26 and inverted to generated a second preliminary output signal, OutP2. Since Shft1 is inverted twice while Shft1 is inverted once, OutP1 and OutP2 will eventually settle to the same logic value after both internal nodes of shifter circuit 210 have fully switched states.

Preliminary output signals OutP1 and OutP2 are provides as inputs to a pair of AND gates. More particularly, OutP2 is provided as an input to AND 21, while OutP1 is provided as an input to AND22. AND21 is also coupled to receive the true value of the selection signal, Sel, as its other input. Meanwhile, AND22 is coupled to receive the complementary value of the selection signal, Sel_b, as its other input. The output of the two AND gates are provided as AO1 (from AND21) and AO2 (from AND22). These two signals are Ored by OR21 to generate the output signal, Out. In addition to being conveyed downstream to other circuitry, the output signal is provided to inverter I25 to generate the complement of the select signal (Sel_b). Sel_b is inverted by I24 to generate the selection signal, Sel.

During a logic 0 to logic 1 transition, the preliminary output signal OutP2 transitions before OutP1. This is due to the fact that, responsive to the input signal transition, N22 activates and pulls down Shft2 faster than P21 activates and pulls up Shft1. This is partly due to the fact that the switching on of P21 is dependent on the activation of N22, as well as due to the fact that the PMOS device is weaker. Accordingly, since Shft1 is the slower of the two shift signals to be generated, generation of OutP2 is slower than generation of OutP1. Meanwhile, the complementary select signal at the time of the generation of OutP1 is a logic 1 due to the fact that the previous output signal was a logic 0. Accordingly, the output of AND22, AO2 is asserted, and propagates through OR21 to generate the output signal as a logic 1.

After the output signal has been generated as a logic 1, the respective states of the select signal and complementary select signal change. In particular, Sel_b falls low, due to inverter I25 inverting the logic 1 on the output of OR21. Inverter I24 inverts Sel_b to generate Sel as a logic 1 in this particular case. Since both OutP1 and OutP2 are at a logic 1 in this case, the assertion of Sel results in the assertion of AO1, thereby allowing the state of the output signal to be held as a logic 1 until the next logical transition of the input signal, even though AO2 will have fallen low to a logic 0 at this time.

When the input signal transitions from a logic 1 to a logic 0, Shft1 falls low (via N21) before Shft2 is pulled high (through P22). Accordingly, OutP1 is falls low before OutP2 in this scenario. As a result, the output of AND21, AO1, remains high until OutP2 falls, and thus causes AO1 to cause OR21 to generate a logic 0 for the output signal. This is also illustrated in the timing diagram on the right hand side of the drawing. After Out falls to a logic 0, Sel_b is generated as a logic 1, while Sel is generated as a logic 0. The output signal remains as a logic 0 until a time after the next logic 0 to 1 transition of the input signal.

Figure 3:
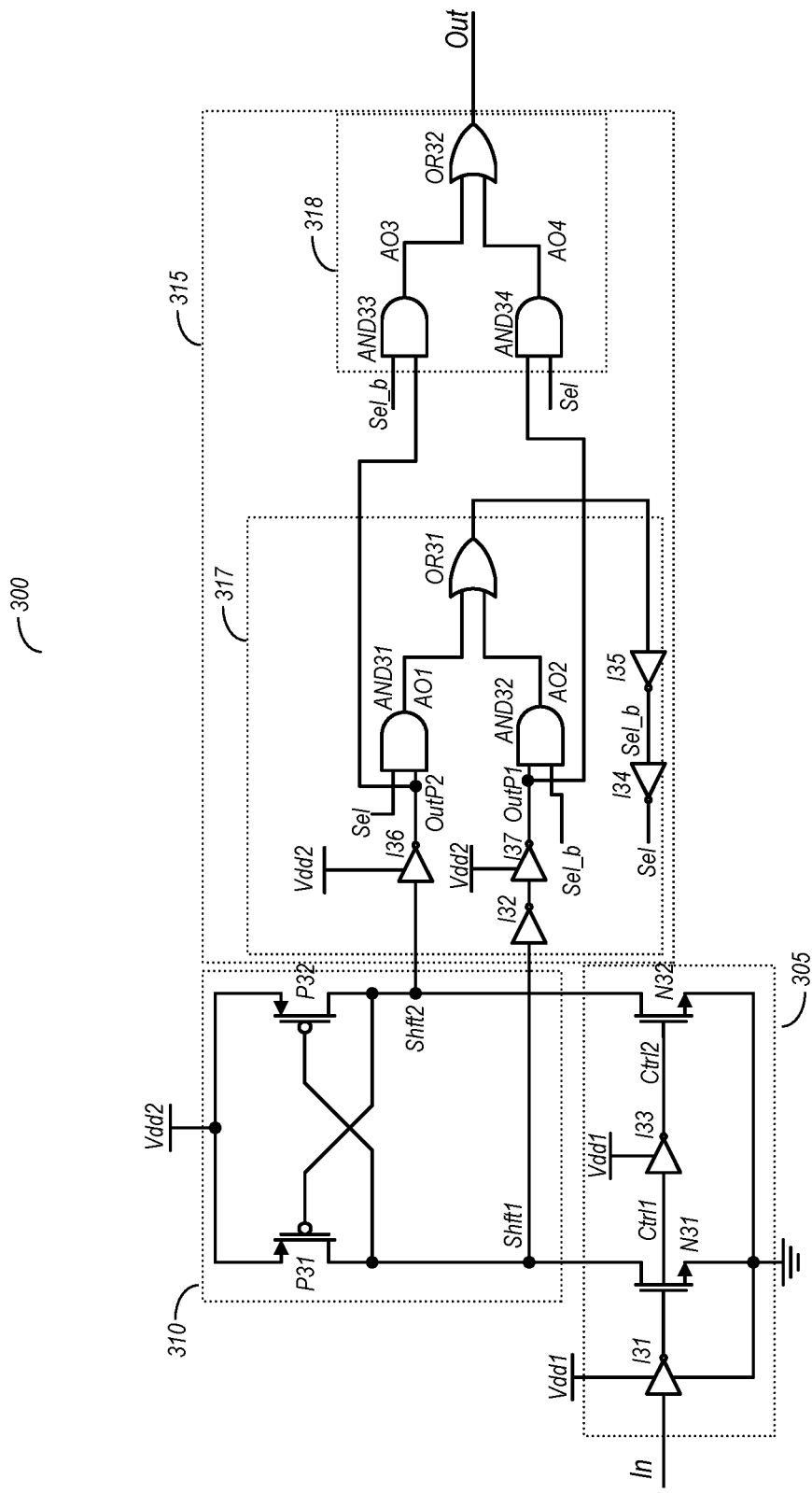
FIG. 3 is a schematic diagram of another embodiment of a level shifter circuit.

FIG. 3 is a schematic diagram of another embodiment of a level shifter. In this embodiment, level shifter 300 includes a control circuit 305, a shifter circuit 310, and a two stage selection circuit 315. Control circuit 305 and shifter circuit 310 in the embodiment of FIG. 3 function largely the same as their equivalent circuits shown in FIG. 2. Similarly, the first stage 317 of selection circuit 315 functions largely the same as selection circuit 215 of FIG. 2. However, with the addition of a second stage 318, level shifter 300 is configured to generate the output signal for a given input signal transition based on the faster internal node of shifter 310. Since the output signal is generated by second stage 318 in this embodiment, first stage 317 is primarily used to update the states of the selection and complementary selection signals in response to a logical transition of the input signal. However, it is noted that, after the circuit is fully settled from an input signal transition, the outputs of OR31 and O32 will be logically equivalent to one another.

Second stage 318 includes an AND gate AND33 coupled to receive OutP2 and Sel_b, and is configured to generate the signal of AO3. AND gate AND34 is coupled to receive the OutP1 and Sel signals. During a logic 0 to 1 transition of the input signal, OutP2 is generated as a logic 1 prior to the generation of OutP1 at the same value. Since Sel_b is logic 1 at this time due to the previous logic 0 output from OR31, AO3 transitions high and thus results in a logic 1 on the output via OR32.

During a logic 1 to 0 transition of the input signal, OutP1 is generated as a logic 0 prior to the generation of OutP2 at the same value. Sel is a logic 1 at this time due to the logic 1 that was previously on the output. Similarly, at the time of the input transition, the output of AND34, AO4, is a logic 1 due to the fact that OutP1 was also a logic 1 as a result of the previous transition, while the output of AND33, AO3, is a logic 0 due to Sel_b being a logic 0 due to the previous logic 1 on the output of OR31. Thus, when OutP1 falls to a logic 1, AO3 falls to a logic 0, as does the output from OR32.

In both of the cases described above, switching of the output signal, from OR32, is based on the internal node of shifter circuit 310 that transitions first after the corresponding transition of the input signal.

Figure 4:
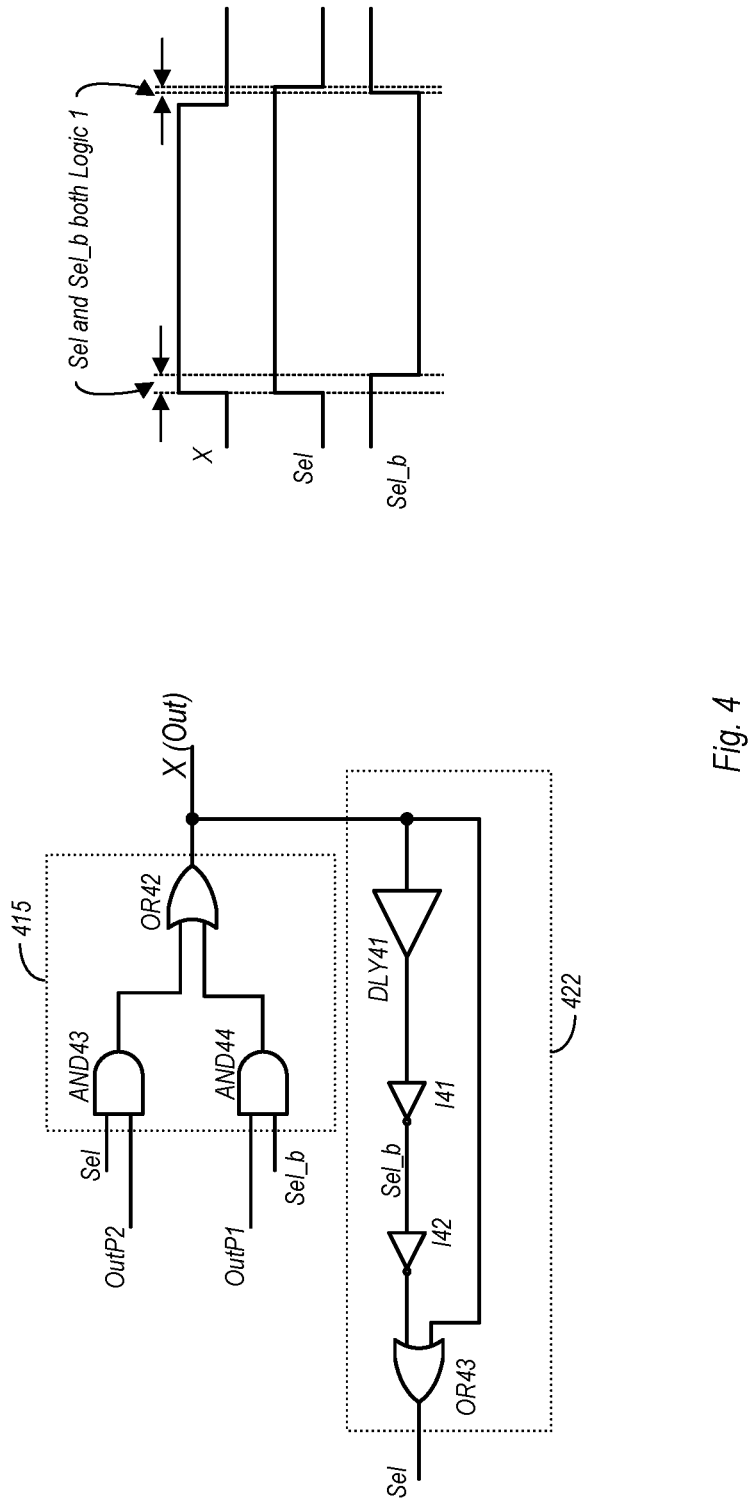
FIG. 4 a schematic diagram of one embodiment of a circuit to stabilize a selection signal in a selection circuit.

Selection Signal Stabilization Circuit:

FIG. 4 is a schematic diagram of one embodiment of a circuit used to stabilize a selection signal. During operation of the selection circuit 215 of FIG. 2 and the first stage 315 of FIG. 3, a race condition can exists for a very brief time in which both Sel_b and Sel are low, based on the inverter that generates the latter of these two signals. This very brief time in which both of these signals are low (logic 0) is undesirable, and can cause oscillation and/or a malfunction of the circuit. Accordingly, a stabilization circuit 422 can be added to inhibit the condition in which both signals are logic 0's at the same time.

Stabilization circuit 422 in the embodiment shown is coupled to the output of OR42 (of selection circuit 415), which is in a logically equivalent configuration to OR21 and OR31 of FIGS. 2 and 3, respectively. The output signal X (or Out in the case of a single-stage selection circuit) is provided to the two branches of stabilization circuit 422, both of which lead to inputs of OR43. In one branch, this signal is provided directly to an input of OR43. In the other branch, the signal is provided to a delay circuit DLY41, which is a buffer that provides delay with an output that is logically equivalent to the input. Inverter I41 generates Sel_b, which in turn is inverted again by I42 before propagating to the other input of O43.

The operation of the circuit is illustrated by the timing diagram on the right-hand side of the drawing. When X transitions to a logic 1, the logic 1 is propagated through the lower branch of stabilization circuit 422 and through OR43. This occurs before the logic 1 has caused Sel_b to transition to a logic 0 on the output of I41. Thus, for a brief time, both Sel and Sel_b are both logic 1's. It is noted that this condition does not cause oscillations or otherwise erroneous operation of selection circuit 415. When X transitions to a logic 0, the logic 1 on Sel is held for a brief time until the logic 0 from X can propagate through DLY41, I41, and I42. Thus, in the case when X transitions to a logic 0, there is time equivalent to an inverter delay of I42 and the gate delay of OR43 when both Sel and Sel_b are logic 1's. This ensures that Sel does not fall to a logic 0 until after Sel_b is high. In both cases, forcing Sel and Sel_b to logic 1's for a brief time during transitions inhibits the occurrence of a situation where both of these signals are simultaneously logic 0. This in turn stabilizes operation of the correspondingly coupled selection circuits.

Figure 5:
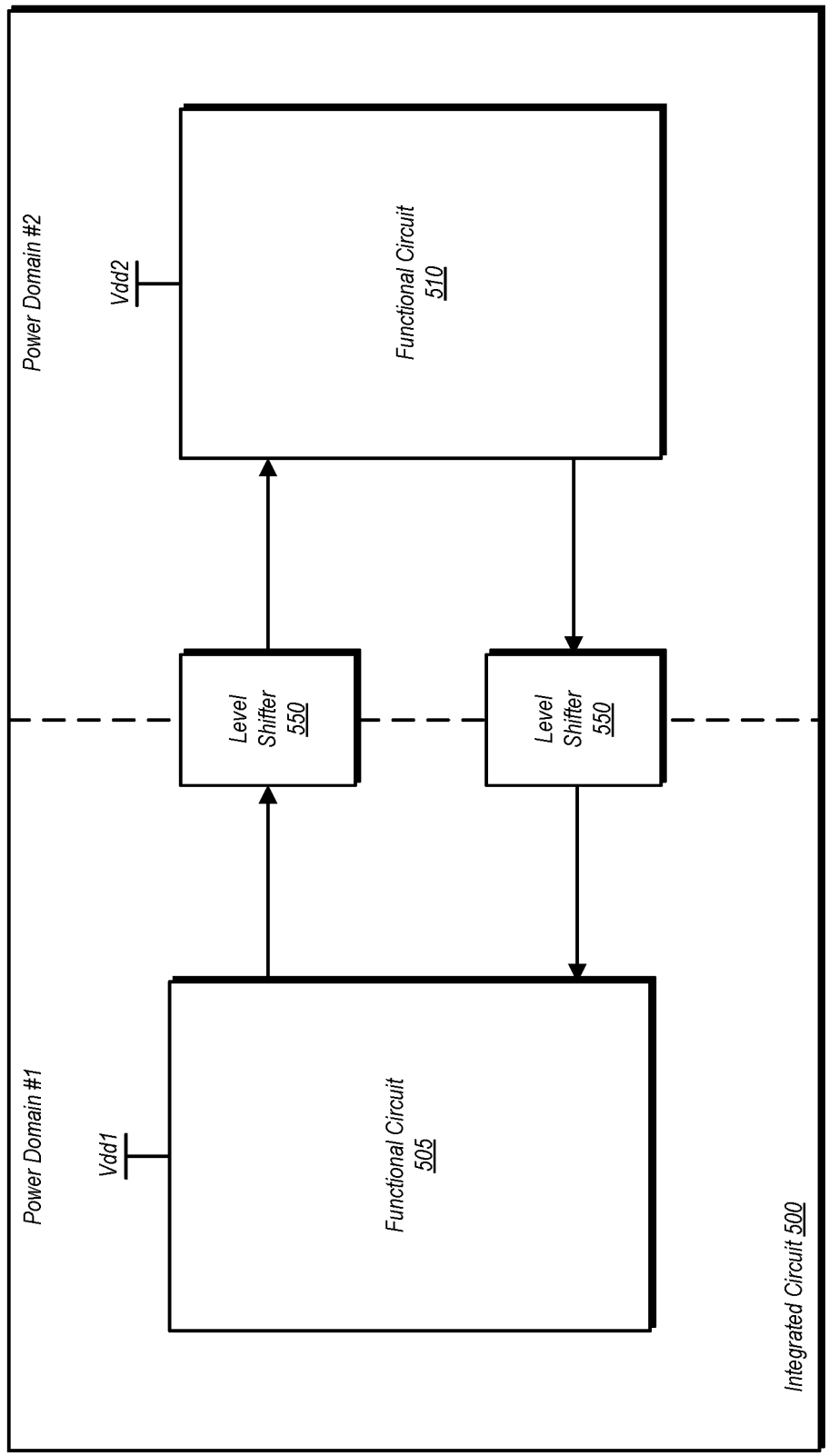
FIG. 5 is a block diagram of one embodiment of an example integrated circuit having level shifters.

Integrated Circuit with Multiple Power Domains:

FIG. 5 is a block diagram of one embodiment of an integrated circuit having multiple power domains and level shifter circuits implemented there between. In the example embodiment of FIG. 5, circuits in Power Domain #1 operate according to a first supply voltage Vdd1, while circuits in Power Domain #2 operate according to a second supply voltage, Vdd2. These two supply voltages are different from one another. In one embodiment the supply voltage Vdd2 is greater than supply voltage Vdd1.

A functional circuit 505 is implemented in Power Domain #1, while another functional circuit 510 is implemented in Power Domain #2. Each of these functional circuits operates in accordance with the supply voltage of their respective power domain. Functional circuits 505 and 510 may be any type of functional circuit, and may include analog, digital, and mixed-signal circuitry. In one example embodiment, functional circuit 505 may be a processor core, while functional circuit 510 may include various input/output (I/O) circuits, with the latter operating at a higher supply voltage relative to the former.

Since there may be requirements for communication between functional circuits 505 and 510 and since the operate at different supply voltages, level shifters 550 are coupled between the two to facilitate communications. At least one, if not both of the instances of level shifter 550 shown here may operate in accordance with one of the various level shifter embodiments discussed above. More particularly, one or both of level shifters 550 may include selection circuitry to carry out a selection based on the switching speeds of internal nodes such that a transition of the input signal propagates to the output at a delay value that is substantially equal for both 0 to 1 and 1 to 0 transitions.

Figure 6:
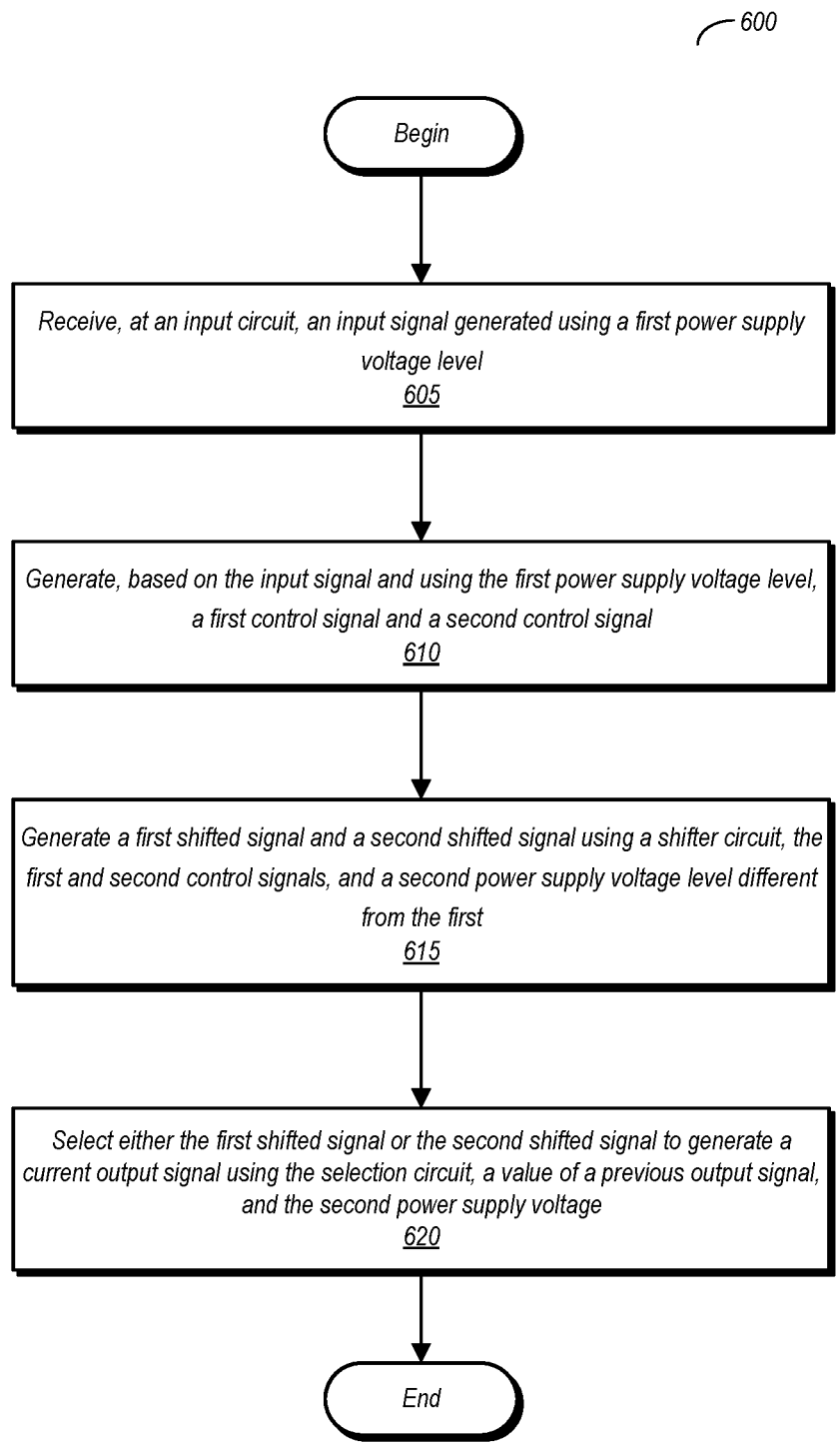
FIG. 6 is a flow diagram of one embodiment of a method for operating a level shifter.

Method Flow Embodiments:

FIG. 6 is a flow diagram of one embodiment of a method for carrying out the operation of a level shifter in accordance with the present disclosure. Method 600 may be carried out by various embodiments of the circuits discussed above. Embodiments of a level shifter circuit capable of carrying out Method 600, but not otherwise disclosed herein, are also considered to fall within the scope of this disclosure.

Method 600 begins with receiving, at an input circuit, an input signal generated using a first power supply voltage level (block 605). In response to the receiving, the method further includes generating, based on the input signal and using the first power supply voltage level, a first control signal and a second control signal (block 610). Based on generation of the first and second control signals, the method includes generating a first shifted signal and a second shifted signal using a shifter circuit, the first and second control signals, and a second power supply voltage level different from the first (block 615). In response to the generation of the first and second shifted signals, the method includes selecting either the first shifted signal or the second shifted signal to generate a current output signal using the selection circuit, a value of a previous output signal, and the second power supply voltage (block 620).

In various embodiments, the method includes generating a selection signal and a complement of the selection signal at different times with respect to one another. The generation of the selection signal may be based on the most recent logical transition of the input signal. In various embodiments, a condition may exist that, if left unchecked, could cause a selection signal and its complement to both be temporarily inactive at the same time, leading to erroneous operation. Therefore, embodiments of the method may also include inhibiting, using a stabilization circuit, the selection signal and the complement of the selection signal from being concurrently inactive.

In various embodiments, the internal nodes of the level shifter circuit may change at different times. In such embodiments, the method includes generating, in response to a first logical transition of the input signal, the first shifted signal prior to generating the second shifted signal. Such embodiments of the method also include generating, in response to a second logical transition of the input signal, the second shifted signal prior to generating the first shifted signal.

In one embodiment, the selection circuit may carry out a selection based on which of the internal nodes is the slowest to change states. Accordingly, in this embodiment, the method includes generating the current output signal, in response to the first logical transition of the input signal, by selecting, using the selection circuit, the second shifted signal and generating the current output signal, in response to the second logical transition of the input signal, by selecting, using the selection circuit, the first shifted signal.

In yet another embodiment, the selection circuit may carry out a selection based on which of the internal nodes is fastest to change states. In this particular embodiment, the method includes generating the current output signal, in response to the first logical transition of the input signal, by selecting, using the selection circuit, the first shifted signal, and generating the current output signal, in response to the second logical transition of the input signal, by selecting, using the selection circuit, the second shifted signal.

Figure 7:
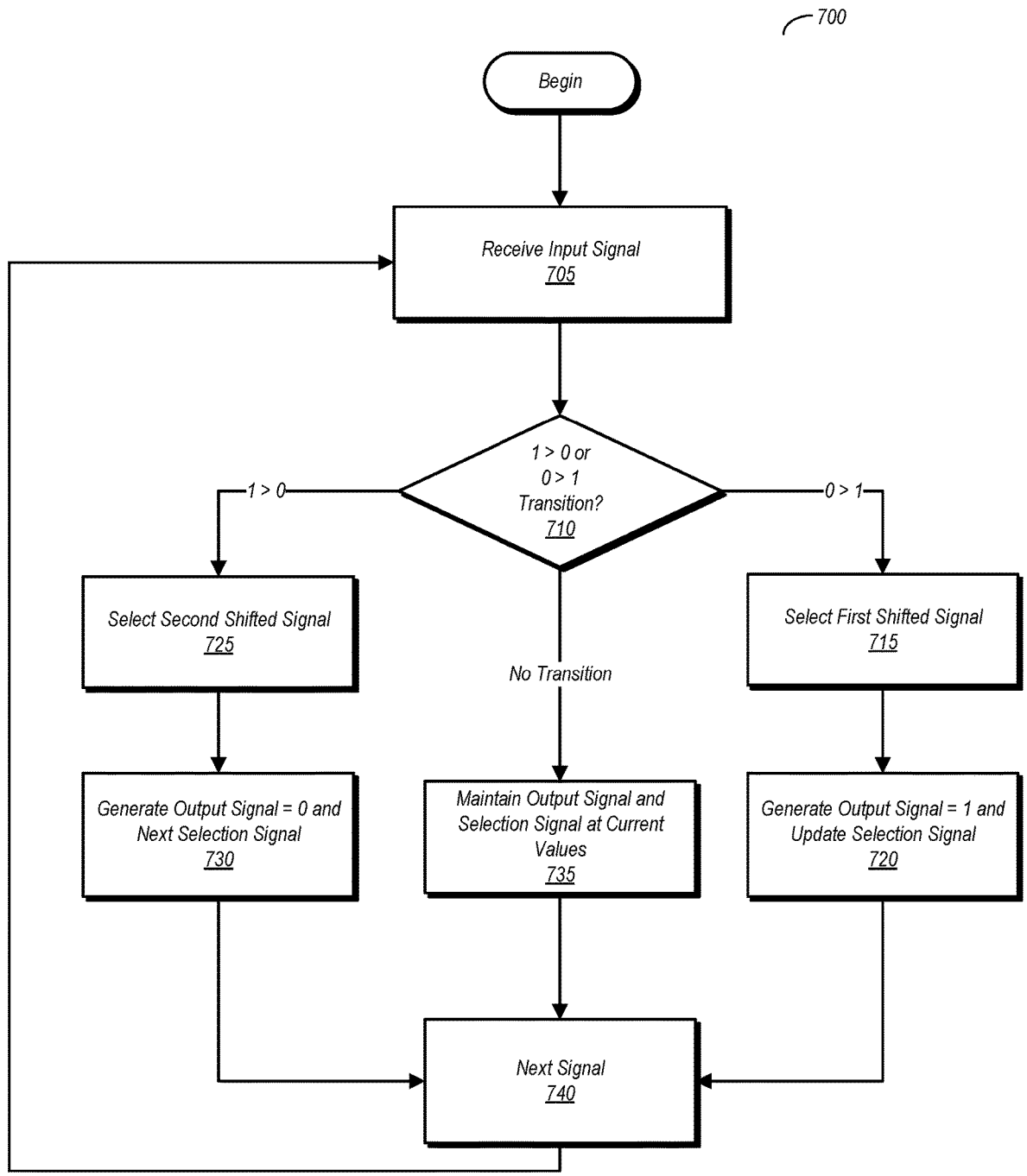
FIG. 7 is a flow diagram of another embodiment of a method for operating a level shifter.

FIG. 7 is a flow diagram of another embodiment of a method for operation a level shifter circuit according to the present disclosure. Method 700 may be carried out by various embodiments of the circuits discussed above. Embodiments of a level shifter circuit capable of carrying out Method 700, but not otherwise disclosed herein, are also considered to fall within the scope of this disclosure.

Method 700 begins with receiving an input signal (block 705). The operation thereafter depends on whether or not the input signal includes a logical transition and, if so, the particular logical transition received. If the logical transition is from a logic 0 to a logic 1 (block 710, 0>1), a selection circuit carries out a selection based on a first shifted signal (block 715). In one embodiment according to the disclosure, the first shifted signal may be taken from a node that is slowest to switch in the shifter circuit. In another embodiment, the first shifted signal may be taken from the node that is fastest to switch. Based on the selection, the output signal is generated and the state of the selection signal is updated (block 720). The method then proceeds to the next input signal (block 740).

If the input signal transition is from a logic 1 to a logic 0 (block 710, 1>0), the second shifted signal is used as the basis for the selection (block 725). The second shifted signal may be taken from the slowest node to switch in some embodiments, or the fastest node to switch in other embodiments. Thereafter, the output signal is generated as a logic while the next selection signal is also generated (block 730). The method then proceeds to the next signal (block 740).

If there is no transition of the input signal (block 710, no transition), the output signal and the selection signal are maintained at their current values (block 735) before processing to the next signal (block 740).

Figure 8:
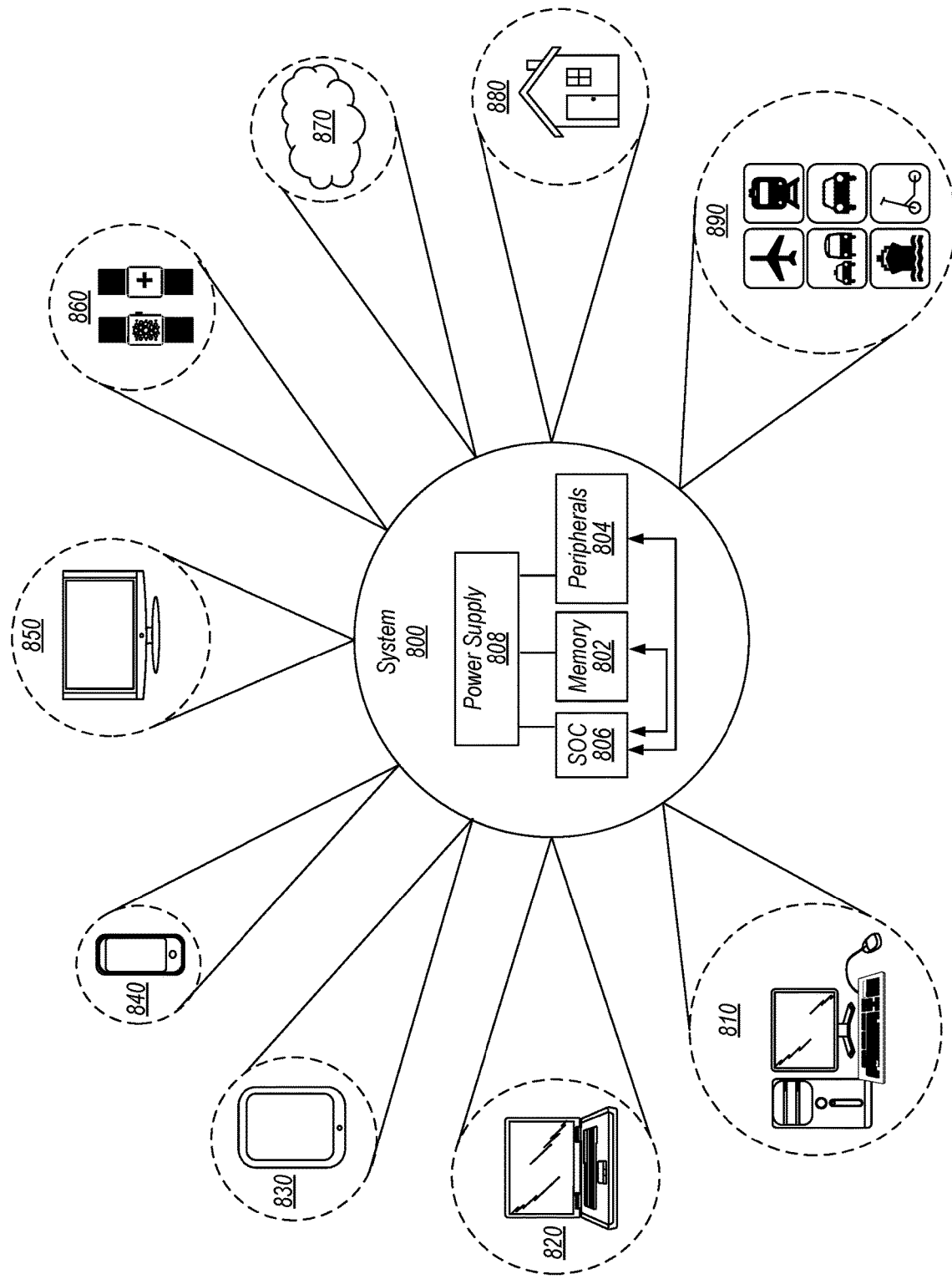
FIG. 8 is a block diagram of one embodiment of an example system.

Example System:

Turning next to FIG. 8, a block diagram of one embodiment of a system 800 is shown that may incorporate and/or otherwise utilize the methods and mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In some embodiments, one or more processors in SoC 806 includes multiple execution lanes and an instruction issue queue. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

SoC 806 in the embodiment shown may include functional circuits that are in different power domains, and which thus operate according to different supply voltages. Accordingly, to facilitate the transfer of signals between different power domains, SoC 806 may include a number of level shifters that are described above in reference to FIGS. 1-7. These level shifters may allow the transfer of signals generated using a first power supply to a circuits operating according to a second power supply, and vice versa.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch 860 may include a variety of general-purpose computing related functions. For example, smartwatch 860 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

It is noted that while the circuits discussed above have been implemented using NMOS and PMOS transistors, the disclosure is not intended to limit embodiments falling within its scope to these types of devices. Thus, in addition to various MOSFET types discussed above, the present disclosure also contemplates embodiments that use non-planar devices such as FinFETs, GAAFETs (Gate All Around FETs), among other types. Embodiments implemented using Bipolar devices are also possible and contemplated. The disclosure further contemplates that technologies that are speculative as of this writing may be used to implement devices in various embodiments of the circuits discussed herein. These technologies include (but are not limited to) graphene transistors, carbon nanotube transistors, gallium arsenide transistors, and so on. The use of memristors in certain circuit structures is also contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to," An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   an input circuit configured to:
      receive an input signal generated using a first power supply voltage level; and
      generate, using the first power supply voltage level, a first control signal and a second control signal using the input signal;
   a shifter circuit configured to generate a first shifted signal and a second shifted signal using the first control signal, the second control signal, and second power supply voltage level different than the first power supply voltage level; and a selection circuit configured to select, using a value of a previous output signal and the second power supply voltage level, one of the first shifted signal or the second shifted signal to generate a current output signal.

2. The apparatus of claim 1, wherein the selection circuit includes a first stage configured to generate first and second preliminary output signals based on the first and second shifted signals, respectively.

3. The apparatus of claim 2, wherein the selection circuit includes a first logic gate coupled to receive the first preliminary output signal and a complement of a selection signal, a second logic gate coupled to receive the second preliminary output signal and a true value of the selection signal, wherein the selection signal is generated based on an output of a third logic gate coupled to receive respective output signals from the first and second logic gates.

4. The apparatus of claim 3, wherein the first stage includes first and second inverters configured to generate the true value of the selection signal and the complement of the selection signal.

5. The apparatus of claim 3, wherein the first and second shifted signals are generated at different times, and wherein the first stage of the selection circuit is configured to generate the selection signal based on which of the first and second shifted signals is a last one to be generated.

6. The apparatus of claim 3, wherein the selection circuit includes a second stage, wherein a first logic gate of the second stage is coupled to receive the first preliminary output signal and a true value of the selection signal, a second logic gate of the second stage is coupled to receive the second preliminary output signal and the complement of the selection signal, and a third logic gate of the second stage is configured to generate the current output signal based on outputs of the first and second logic gates of the second stage.

7. The apparatus of claim 6, wherein the first and second shifted signals are generated at different times, and wherein the second stage of the selection circuit is configured to generate the selection signal based on which of the first and second shifted signals is a first one to be generated.

8. The apparatus of claim 2, wherein the first stage is configured to generate the selection signal and a complement of the selection signal with a delay relative to one another, and wherein the first stage further includes a stabilization circuit configured to inhibit the selection signal and the complement of the selection signal from both being concurrently inactive.

9. The apparatus of claim 1, wherein the selection circuit is configured to perform a selection based on whether the input signal undergoes a first logical transition or a second logical transition.

10. The apparatus of claim 9, wherein the shifter circuit is configured to generate the first shifted signal prior to generating the second shifted signal in response to the first logical transition of the input signal, and further configured to generate the second shifted signal prior to generating the first shifted signal in response to the second logical transition of the input signal.

11. A method comprising:
receiving, at an input circuit, an input signal generated using a first power supply voltage level;

generating, based on the input signal and using the first power supply voltage level, a first control signal and a second control signal;

generating a first shifted signal and a second shifted signal using a shifter circuit, the first and second control signals, and a second power supply voltage level different from the first; and selecting either the first shifted signal or the second shifted signal to generate a current output signal using a selection circuit, a value of a previous output signal, and the second power supply voltage.

12. The method of claim 11, further comprising:
generating a selection signal and a complement of the selection signal at different times with respect to one another;
inhibiting, using a stabilization circuit, the selection signal and the complement of the selection signal from being concurrently inactive.

13. The method of claim 12, further comprising:
generating, in response to a first logical transition of the input signal, the first shifted signal prior to generating the second shifted signal; and
generating, in response to a second logical transition of the input signal, the second shifted signal prior to generating the first shifted signal.

14. The method of claim 13, further comprising:
generating the current output signal, in response to the first logical transition of the input signal, by selecting, using the selection circuit, the second shifted signal; and
generating the current output signal, in response to the second logical transition of the input signal, by selecting, using the selection circuit, the first shifted signal.

15. The method of claim 13, further comprising:
generating the current output signal, in response to the first logical transition of the input signal, by selecting, using the selection circuit, the first shifted signal; and
generating the current output signal, in response to the second logical transition of the input signal, by selecting, using the selection circuit, the second shifted signal.

16. An integrated circuit comprising:
a first functional circuit configured to operate using a first supply voltage;
a second functional circuit configured to operate using a second supply voltage different from the first supply voltage; and
a level shifter circuit coupled to receive, from the first functional circuit, and input signal generated using the first supply voltage, and configured to output, to the second functional circuit, a current output signal generated using the second supply voltage, wherein the level shifter circuit includes:
an input circuit configured to generate, using the first supply voltage and based on the input signal, first and second control signals;
a shifter circuit configured to generate first and second shifted signals using the first and second control signals, respectively, using the second supply voltage; and
a selection circuit configured to generate the current output signal using a value of a previous output signal and one of the first and second shifted signals.

17. The integrated circuit of claim 16, wherein the selection circuit is coupled to receive the first and second shifted signals, wherein the selection circuit includes a first stage configured to generate a selection signal and a complementary selection signal using a first stage output signal, and further configured to generate first and second preliminary output signals.

18. The integrated circuit of claim 17, wherein the selection circuit includes a second stage coupled to receive the selection signal, the complementary selection signal, and the first and second preliminary output signals, wherein the second stage is configured to generate the current output signal.

19. The integrated circuit of claim 17, wherein the first stage is configured to generate the selection signal and the complementary selection signal with a delay relative to one another, and wherein the first stage further includes a stabilization circuit configured to inhibit the selection signal and the complementary selection signal from both being concurrently inactive.

20. The integrated circuit of claim 16, wherein the shifter circuit is configured to generate the first shifted signal prior to generating the second shifted signal in response to a first logical transition of the input signal, and further configured to generate the second shifted signal prior to generating the first shifted signal in response to a second logical transition of the input signal, and wherein the selection circuit is configured to generate the output signal at a delay that is substantially equal for both the first and second logical transitions.

* * * * *